United States Patent
Meer et al.

(10) Patent No.: US 12,366,612 B2
(45) Date of Patent: Jul. 22, 2025

(54) DEVICE FOR DETECTING A SHORT-CIRCUIT FAULT IN A WINDING OF AN ELECTRIC MACHINE

(71) Applicant: SAFRAN ELECTRICAL & POWER, Blagnac (FR)

(72) Inventors: Frédéric Meer, Blagnac (FR); Eric De Wergifosse, Blagnac (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 0 days.

(21) Appl. No.: 18/877,764

(22) PCT Filed: Jun. 20, 2023

(86) PCT No.: PCT/FR2023/050922
§ 371 (c)(1),
(2) Date: Dec. 20, 2024

(87) PCT Pub. No.: WO2023/247890
PCT Pub. Date: Dec. 28, 2023

(65) Prior Publication Data
US 2025/0164582 A1 May 22, 2025

(30) Foreign Application Priority Data
Jun. 24, 2022 (FR) .................... 2206300

(51) Int. Cl.
*G01R 31/72* (2020.01)
*G01R 15/18* (2006.01)
(Continued)

(52) U.S. Cl.
CPC ............ *G01R 31/72* (2020.01); *G01R 15/18* (2013.01); *G01R 19/16571* (2013.01); *G01R 31/52* (2020.01)

(58) Field of Classification Search
CPC ........ G01R 31/72; G01R 31/52; G01R 15/18; G01R 19/16571
See application file for complete search history.

(56) References Cited

U.S. PATENT DOCUMENTS

2015/0276823 A1* 10/2015 Rodriguez ............. G01R 23/00
  702/75
2015/0276880 A1* 10/2015 Sharma ............... G01R 19/0046
  702/58
(Continued)

FOREIGN PATENT DOCUMENTS

CN    100372200 C    2/2008
CN    105548799 A    5/2016
(Continued)

OTHER PUBLICATIONS

Search Report and Written Opinion issued in International Application No. PCT/FR2023/050922, mailed Oct. 18, 2023.
(Continued)

*Primary Examiner* — Lee E Rodak
*Assistant Examiner* — Demetrius R Pretlow
(74) *Attorney, Agent, or Firm* — Bookoff McAndrews, PLLC

(57) ABSTRACT

An electric machine including at least one phase including two electrical paths in parallel, each electrical path of one and the same phase including a winding, the first electrical paths of all the phases being connected to one and the same first electrical node and the second electrical paths of all the phases being connected to one and the same second electrical node, the electric machine includes an equipotential wire electrically connecting the first and second electrical nodes and a current sensor configured to measure an electric current circulating in the equipotential wire.

4 Claims, 1 Drawing Sheet

(51) Int. Cl.
G01R 19/165 (2006.01)
G01R 31/52 (2020.01)

(56) References Cited

U.S. PATENT DOCUMENTS

| | | |
|---|---|---|
| 2016/0178699 A1 | 6/2016 | Schmaus et al. |
| 2020/0158790 A1 | 5/2020 | Kimura et al. |
| 2021/0067072 A1* | 3/2021 | Alla .................. G01R 31/62 |

FOREIGN PATENT DOCUMENTS

| | | |
|---|---|---|
| CN | 206618840 U | 11/2017 |
| CN | 109217251 A | 1/2019 |
| CN | 111983513 A | 11/2020 |

OTHER PUBLICATIONS

First Search issued in corresponding Chinese Application No. 202380054878.0, mailed Apr. 27, 2025.

* cited by examiner

[Fig. 1]
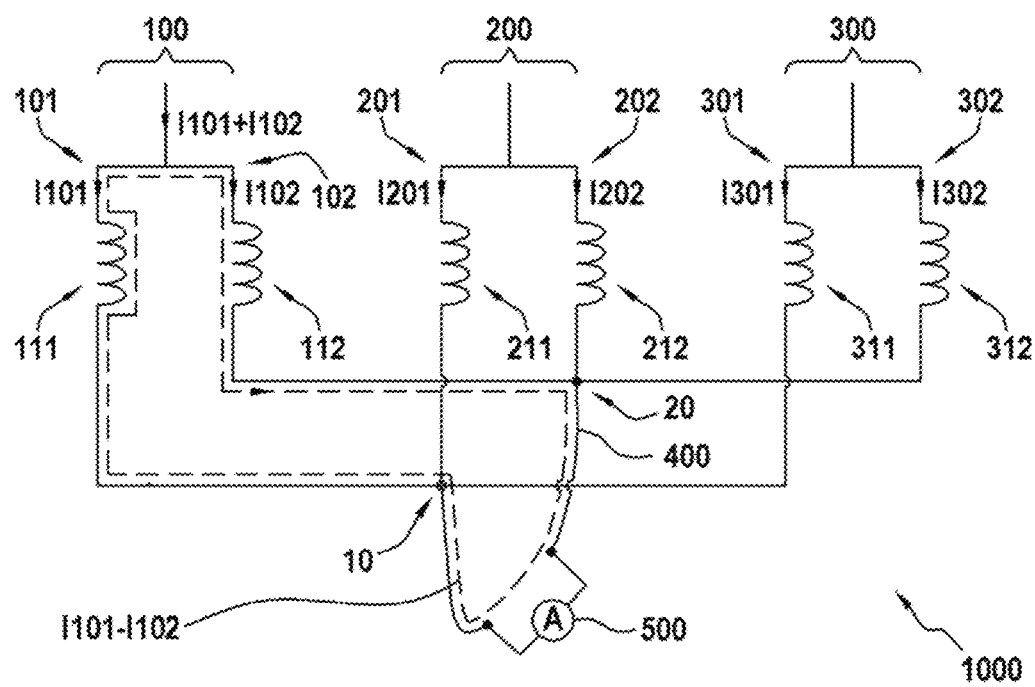
[Fig. 2]
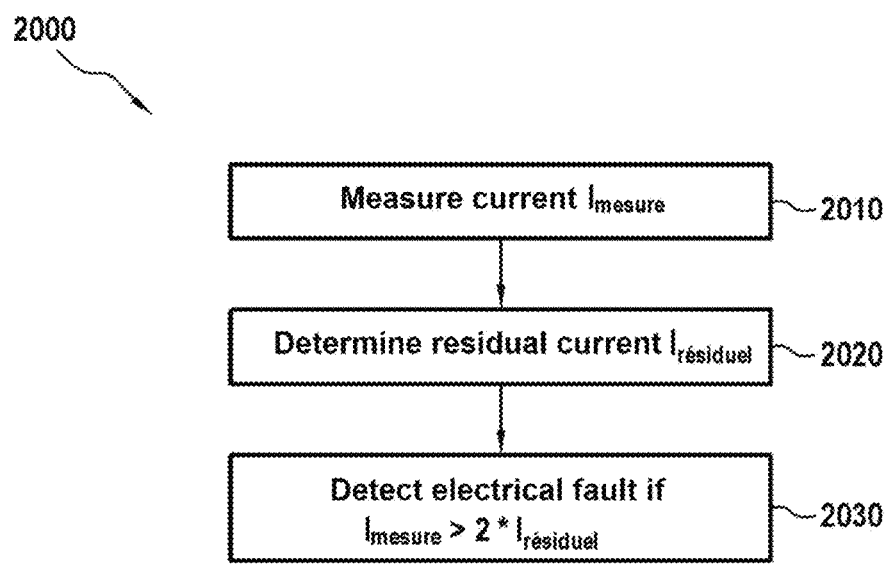

DEVICE FOR DETECTING A SHORT-CIRCUIT FAULT IN A WINDING OF AN ELECTRIC MACHINE

CROSS-REFERENCE TO RELATED APPLICATIONS

This is a National Stage Application under 35 U.S.C. § 371 of International Application No. PCT/FR2023/050922, filed Jun. 20, 2023, now published as WO 2023/247890 A1, which claims priority to French Patent Application No. 2206300, filed on Jun. 24, 2022, the entireties of which are incorporated herein by reference.

TECHNICAL FIELD

This invention relates to the general field of the detection of a short-circuit in a winding of an electric machine, and more specifically the detection of a short-circuit between the turns of the windings.

PRIOR ART

The windings of electric machines consist of enameled wires. The enamel, and also the impregnating resin, form an insulation which in some cases can develop faults. This can cause a short-circuit which appears locally and generates local heating which can lead to the melting of the copper. It is therefore essential to protect the electric machine as soon as such a fault is observed. In addition, machines with permanent magnets are increasingly used and it is becoming increasingly difficult to neutralize the short-circuit by a command. It is therefore essential to quickly detect such a fault to minimize its consequences.

In the prior art, detection methods are based on the analysis of current or voltage signals. The measured currents are analyzed with signal processing techniques to detect harmonics characteristic of each type of fault. These methods have the advantage of not requiring any particular item of equipment within the electric machine and of being able to identify the nature of the fault. However, the information is difficult to distinguish from the normal operation of the electric machine, since this machine already has many imperfections. In addition, each electric machine has its own "signature" and it is difficult to extend these general methods to several machines.

Other known methods consist in implementing temperature sensors within the windings of the electric machine to detect heating. However, this requires a large number of sensors due to the very localized nature of the heating.

It is therefore desirable to possess a device for quickly and sensitively detecting a short-circuit between the turns of a winding of an electric machine.

SUMMARY OF THE INVENTION

The invention relates to an assembly of an electric machine comprising at least one phase including two electrical paths in parallel, each electrical path of one and the same phase including a winding, the first electrical paths of all the phases being connected to one and the same first electrical node and the second electrical paths of all the phases being connected to one and the same second electrical node and means for detecting a short circuit between at least two turns of a winding of a phase, characterized in that the electric machine comprises an equipotential wire electrically connecting the first and second electrical nodes and a current sensor configured to measure an electric current circulating in the equipotential wire, and in that the detecting means are configured to compare the electric current measured by the current sensor to a detection threshold equal to at least twice a residual current circulating in the equipotential wire in the absence of any short circuit between turns of said windings.

By measuring the electric current circulating in the equipotential wire, the current sensor in particular measures the electric circulation current between the two electrical paths of one and the same phase. In addition, owing to the placement of this equipotential wire connecting the two electric nodes, the circulation current between the two paths of all the phases can be measured. Specifically, as the two parallel electrical paths within one and the same phase have an identical voltage, under normal operation, i.e. in the absence of any fault of the electric machine, the sensor measures a zero or very small electric current (presence of residual noise in practice less than 5% of the nominal current of the machine) since the two parallel paths of the phases are traversed by an identical magnetic flux at any time. If a short circuit occurs between the turns of a winding of any electrical path of a phase, this has the effect of causing a voltage imbalance between the two paths of the phase in question, since the short circuit between two turns in an electrical path manifests as a reduced number of turns (one turn less) in this path, and since in addition, the short circuit has the effect of reducing the flux in the path which has the fault (application of Lenz' law). The induced voltage resulting from the product of the number of turns by the flux (Faraday's law) is therefore reduced in the path which has the fault. In this case, the sensor will measure the appearance of a significant current, particularly a current at least twice as large as the residual current under normal operation, i.e. in the absence of any short circuit between turns.

The placement of the current sensor at the equipotential wire thus makes it possible to be able to detect a short-circuit fault between the turns of the windings of the electric machine. In addition, owing to this equipotential wire, only a single current sensor is needed to detect short circuits between the turns in all the phases of the electric machine. Thus, the electric machine of the invention comprises a means for detecting short circuits which is of small bulk, quick and sensitive by comparison with a solution of the kind previously described requiring the incorporation of temperature sensors in sufficient number and effective only if they are placed near the fault.

In addition, this current sensor does not require provision to be made for any complex processing means for detecting a short circuit. It is enough to simply detect the increase in measured electric current to detect the short circuit. If desired, filtering means can be added to improve the quality of the current measurements.

According to a particular feature of the invention, the current sensor is a current transformer and the equipotential wire is placed at the center of the current transformer.

This makes it possible to obtain an electric machine equipped with a compact means for detecting a short circuit.

As the measured current is virtually zero in the absence of any electrical fault, the equipotential wire needs to be dimensioned to withstand a current in the order of the nominal current of the machine only during the measurement and detection time, which can be less than a second. Thus, the equipotential wire is dimensioned for a much smaller current rating than the wire of the windings of the electric machine. It has, for example, a section four times smaller than the winding of one of the electrical paths.

Another subject of the invention is a method for detecting a short circuit in an electric machine according to the invention comprising the measurement of an electric current circulating in the equipotential wire, the determination of a residual electric current circulating in the equipotential wire, and the detection of a short circuit if the measured electric current becomes greater than a detection threshold equal to at least twice the determined residual electric current.

As explained previously, in the event of a short circuit between the turns of the first electrical path of one of the phases of the electric machine, the increase in electric current measured with respect to the residual electric current makes it possible to detect this short circuit. The detection threshold, at least twice as high as the determined residual electric current, makes it possible to ensure reliable detection of short circuits, i.e. without any detection errors related to residual noise in the electric machine in question, the factor of two constituting a sufficient margin with respect to the residual current (residual noise) for it to be considered that if the current exceeds this threshold there is indeed a proven short-circuit fault in the electric machine.

According to a particular feature of the invention, the residual electric current is determined in the factory.

BRIEF DESCRIPTION OF THE DRAWINGS

Other features and advantages of this invention will become apparent from the description given below, with reference to the appended drawings which illustrate exemplary embodiments without any limitation.

FIG. 1 schematically and partially represents an electric machine and means for detecting a short circuit between the turns of the machine according to an embodiment of the invention.

FIG. 2 schematically represents a method for detecting a short circuit between two turns in the electric machine of FIG. 1 according to an embodiment of the invention.

DESCRIPTION OF THE EMBODIMENTS

FIG. 1 schematically and partially represents the assembly comprising an electric machine 1000 and means for detecting a short circuit between at least two turns of a winding of a phase of the machine 1000 according to an embodiment of the invention.

The electric machine 1000 comprises three phases 100, 200 and 300.

The first phase 100 comprises two electrical paths 101 and 102. Each path 101 and 102 comprises a winding 111, 112. On entering the phase 100, a current $I101+I102$ circulates, then in the first path 101, the current $I101$ circulates while in the second path 102, the current $I102$ circulates.

The second phase 200 and the third phase 300 also comprise two electrical paths 201, 202 and 301, 302 like the first phase 100. Just like the first phase 100, on entering the phases 200 and 300, a current circulates, then splits between the two paths 201, 202 and 301, 302 of the two phases 200 and 300. Thus, the current $I201$ circulates in the path 201, the current $I202$ circulates in the path 202, the current $I301$ circulates in the path 301 and the current $I302$ circulates in the path 302.

Each first electrical path 101, 201, 301 of the three phases 100, 200, 300 is connected to one and the same electrical node 10, and each second electrical path 102, 202, 302 of the three phases 100, 200, 300 is connected to one and the same electrical node 20.

The electric machine 1000 also comprises an equipotential wire 400 electrically connecting the first 10 and second 20 electrical nodes. The machine 1000 comprises a current sensor 500 configured to measure an electric current $(I101+I201+I301)-(I102+I202+I302)$ able to circulate in the equipotential wire 400.

The detection of a short circuit in the electric machine in operation is based on the measurement of the current in the equipotential wire 400 by the current sensor 500. According to the invention, this current measurement by the sensor 500 is compared to a predetermined detection threshold, which is at least equal to twice the value of the residual current I measurable in the absence of any electrical fault.

The detection of a short-circuit fault makes it possible to safety the electric machine 1000, for example by short-circuiting all the phases 100, 200, 300 in order to reduce the short-circuit current between the turns and/or by shutting down the electric machine by mechanical disconnection of the rotor.

Under normal operation of the machine 1000, the two paths (101, 102), (201, 202) and (301, 302) within one and the same phase 100, 200 and 300 have the same induced voltage at their terminals since they are traversed by a magnetic flux of the same value at any time as is customary for a parallel connection. The current $(I101+I201+I301)-(I102+I202+I302)$ circulating in the equipotential wire 400 is therefore zero or virtually zero, the presence of a residual or noise current being possible. This residual current is in practice less than 5% of the nominal current of the electric machine 1000. Thus, under normal operation of the electric machine 1000, the current $(I101+I201+I301)-(I102+I202+I302)$ measured by the single current sensor 500 is zero, or virtually zero.

If a short circuit occurs between the turns of one of the windings 111, 112, 211, 212, 311, 312, the current $(I101+I201+I301)-(I102+I202+I302)$ measured by the current sensor 500 will no longer be zero and the increase in current measured by the sensor 500 makes it possible to detect the short circuit.

For example, if a short circuit appears between the turns of one of the windings 111, 112 of the first phase 110, a non-zero circulation current $I101$-$I102$ appears between the paths 101 and 102. It is shown in dotted lines on FIG. 1. The current $(I101+I201+I301)-(I102+I202+I302)$ measured by the sensor 500 is then equal to $I101$–$I102$. This current measured by the sensor is compared to the detection threshold, making it possible to detect a short-circuit fault and to safety the electric machine where applicable.

This detection according to the invention is done via the addition of a single equipotential wire 400 and a single current sensor 500 measuring the current circulating in this wire 400, and by a comparison based on a detection threshold determined with respect to the residual current measurable in the wire 400 in the absence of any electrical fault, greater than at least twice this residual current, ensuring a reliable detection. The equipotential wire 400 and the current sensor 500 thus form a means for detecting a short circuit between at least two turns of a winding of a phase of the electric machine 1000.

Since the electric machine 1000 has N turns per phase, a short circuit between two turns in an electrical path manifests as an imbalance in the number of turns in the proportion 1/N. The current in the equipotential wire 400 in the event of a fault will be higher when the number of turns per phase is lower. The invention is thus particularly applicable to machines in which the number of turns per phase N is not very high, for example less than or equal to 50.

For example, and with reference to FIG. 1, if the windings of the electrical paths of a phase each comprise 20 turns, then in the event of a short circuit between two turns of one of these windings, the electrical path in question will not have more than 19 turns, hence an imbalance in the number of turns of 5%. The induced voltages will therefore be different in the two parallel paths, due solely to the difference of the number of turns accentuated by the fact that the magnetic flux in the path having the fault will itself also be reduced by the effect of the current in the short-circuiting turn in accordance with Lenz's law. The circulation current measured by the current sensor is hence significantly higher than the residual current determined under normal operation, which makes it possible to set a threshold of detection of short-circuit faults at least twice as high as the residual current determined for the electric machine, the factor of two constituting a sufficient margin with respect to the residual current for it to be considered that, if the current exceeds this threshold, there is indeed a proven fault.

FIG. 2 schematically represents a method 2000 for detecting a short circuit between two turns in an electric machine of the invention, for example in the electric machine 1000 of FIG. 1.

The method 2000 comprises the measurement 2010 of the electric current $I_{mesure}$ (or of the current (I101+I201+I301)−(I102+I202+I302) according to the references of FIG. 1) circulating in the equipotential wire 400, the determination 2020 of the residual current $I_{residuel}$ circulating in the equipotential wire 400 and the detection 2030 of a short circuit when $I_{mesure}$ is twice as high as $I_{residuel}$. In other words, the detection threshold is at least equal to twice $I_{residuel}$.

The current $I_{residuel}$ corresponds to the residual noise circulating in the equipotential wire 400 under normal operation of the electric machine 1000, and as explained with reference to FIG. 1, this residual current $I_{residuel}$ is zero or virtually zero, under any circumstances less than, on average, 5% of the nominal current in the electric machine 1000. This residual current is a measurable characteristic of the electric machine under consideration. In particular, the determination of this $I_{residuel}$ (step 2020) can advantageously be done during characterization tests on the prototypes of the electric machine under consideration. The value $I_{residuel}$ determined for the prototype is the value $I_{residuel}$ characteristic of the electric machines corresponding to this prototype. In a variant, provision can be made for measuring $I_{residuel}$ on each electric machine before its entry into service. In other words, the residual current $I_{residuel}$ can be determined in the factory.

Different embodiments of the detection and in particular of the comparison of the current measurement signal provided by the sensor to a defined detection threshold can be envisioned using any hardware or software technique known to those skilled in the art. In the case of a software embodiment, the residual current measured for the electric machine (during tests on a prototype or on the machine itself) is a parameter of the machine for example stored in the memory in a registry or a memory of control means of the electric machine. In the case of a hardware embodiment, the comparison circuit is designed to ensure the detection of a current higher than a defined detection threshold, greater than at least twice the residual current determined for the electric machine under consideration.

Whatever the embodiment, the electric machine 1000 may also comprise a fuse device configured to limit the heating of the equipotential wire 400 in the event of a short circuit in the phases 100, 200, 300 of the machine.

The electric machine 1000 has been described with three phases, but it can more generally comprise N phases, with N an integer greater than or equal to 1.

The invention claimed is:

1. An assembly of an electric machine comprising at least one phase including two electrical paths in parallel, each electrical path of one and a same phase including a winding, a first electrical path of all the phases being connected to one and a same first electrical node and a second electrical path of all the phases being connected to one and the same second electrical node and means for detecting a short circuit between at least two turns of a winding of a phase, wherein the means for detecting the short circuit of the electric machine comprises an equipotential wire electrically connecting the first and second electrical nodes, a current sensor configured to measure an electric current circulating in the equipotential wire and a comparison circuit; the means for detecting is configured to compare the electric current measured by the current sensor to a detection threshold equal to at least twice a residual current circulating in the equipotential wire in an absence of any short circuit between turns of said windings.

2. The assembly as claimed in claim 1, wherein the current sensor is a current transformer and the equipotential wire is placed at a center of the current transformer.

3. A method for detecting a short circuit in an electric machine as claimed in claim 1 comprising a measurement of an electric current circulating in the equipotential wire, a determination of a residual electric current circulating in the equipotential wire, and the detection of a short circuit if the measured electric current becomes greater than a detection threshold equal to at least twice the determined residual electric current.

4. The method as claimed in claim 3, wherein the residual electric current is determined in a factory.

* * * * *